(12) United States Patent
Harshfield et al.

(10) Patent No.: US 7,235,419 B2
(45) Date of Patent: Jun. 26, 2007

(54) METHOD OF MAKING A MEMORY CELL

(75) Inventors: Steven T. Harshfield, Emmett, ID (US); David Q. Wright, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/302,119

(22) Filed: Dec. 14, 2005

(65) Prior Publication Data

US 2006/0099822 A1 May 11, 2006

Related U.S. Application Data

(60) Continuation of application No. 10/205,387, filed on Jul. 25, 2002, now Pat. No. 7,071,021, which is a division of application No. 09/853,233, filed on May 11, 2001, now Pat. No. 7,102,150.

(51) Int. Cl.
*H01L 21/00* (2006.01)
(52) U.S. Cl. .................... 438/95; 257/E31.02
(58) Field of Classification Search .............. 438/95
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |

(Continued)

FOREIGN PATENT DOCUMENTS

JP 5-6126916 10/1981

(Continued)

OTHER PUBLICATIONS

U.S. Appl. No. 10/916,421, filed Aug. 2004, Campbell.

(Continued)

*Primary Examiner*—William David Coleman
(74) *Attorney, Agent, or Firm*—Dickstein Shapiro, LLP

(57) ABSTRACT

An inverted PCRAM cell is formed by plating the bottom electrode, made of copper for example, with a conductive material, such as silver. Chalcogenide material is disposed over the plated electrode and subjected to a conversion process so that ions from the plated material diffuse into the chalcogenide material.

30 Claims, 8 Drawing Sheets

U.S. PATENT DOCUMENTS

| | | | |
|---|---|---|---|
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,314,772 A | 5/1994 | Kozicki | |
| 5,315,131 A | 5/1994 | Kishimoto et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,360,981 A | 11/1994 | Owen et al. | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,236,059 B1 | 5/2001 | Wolsteinholme et al. | |
| RE37,259 E | 7/2001 | Ovshinsky | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,648 B2 | 1/2004 | Lowery | |
| 6,673,700 B2 | 1/2004 | Dennison et al. | |
| 6,674,115 B2 | 1/2004 | Hudgens et al. | |
| 6,687,153 B2 | 2/2004 | Lowrey | |
| 6,687,427 B2 | 2/2004 | Ramalingam et al. | |
| 6,690,026 B2 | 2/2004 | Peterson | |
| 6,696,355 B2 | 2/2004 | Dennison | |

| | | | |
|---|---|---|---|
| 6,707,712 B2 | 3/2004 | Lowery | |
| 6,714,954 B2 | 3/2004 | Ovshinsky et al. | |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Kozicki | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

FOREIGN PATENT DOCUMENTS

| | | | |
|---|---|---|---|
| WO | WO 97/48032 | 12/1997 | |
| WO | WO 99/28914 | 6/1999 | |
| WO | WO 00/48196 | 8/2000 | |
| WO | WO 02/21542 | 3/2002 | |

OTHER PUBLICATIONS

U.S. Appl. No. 10/893,299, filed Jul. 2004, Campbell.

Abdell-All, A.; Elshafie,A.; Elhawary, M.M., DC Electric-field Effect in Bulk and Thin-film Ge5As38Te57 Chalcogenide Glass, Vacuum 59 (2000) 845-853.

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized-Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resitance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instablity in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) 17th (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L. , Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale; R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-932.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5—Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcogenides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metallurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ (05x50.20) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shernetova, V.K., Memory and Threshold Switching Effects in Amorphous Selenium, Phys. Stat. Sol (a) (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert, H.;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| ath the Rigidity Percolation Threshold (<m>=2.4), J. Non-Cryst. Solids 151 (1992) 149-154.

Jacques Coderre; Electroless Ni/Au and Process Control; Process Unit; Printed Circuit Fabrication 1978-1998; pp. 42-46.

Don Cullen; Electroless Nickel/Immersion Gold; Ni/Au; Printed Circuit Fabrication 1978-1988 pp. 32-39.

Jean W. Chevaiir; Electroless Gold Plating; pp. 323-325.

METHOD OF MAKING A MEMORY CELL

CROSS-REFERENCE TO RELATED APPLICATIONS

This application is a continuation of U.S. patent application Ser. No. 10/205,387, filed on Jul. 25, 2002 now U.S. Pat. No. 7,071,021 which in turn was a divisional of U.S patent application Ser. No. 09/853,233, filed on May 11, 2001 now U.S. Pat. No. 7,102,150. Both applications are incorporated in their entirety herein by reference.

BACKGROUND OF THE INVENTION

1. Field of the Invention

The invention relates generally to the field of semiconductor devices and fabrication and, more particularly, to memory elements and methods for making memory elements.

2. Background of the Related Art

This section is intended to introduce the reader to various aspects of art which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in one or more memory devices that are coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, volatile memories, such as dynamic random access memories (DRAMs), must be continually powered in order to retain their contents, but they tend to provide greater storage capability and programming options and cycles than non-volatile memories, such as read only memories (ROMs). While non-volatile memories that permit limited reprogramming exist, such as electrically erasable and programmable "ROMs," all true random access memories, i.e., those memories capable of $10^{14}$ programming cycles are more, are volatile memories. Although one time programmable read only memories and moderately reprogrammable memories serve many useful applications, a true nonvolatile random access memory (NVRAM) would likely be needed to surpass volatile memories in usefulness.

Efforts have been underway to create a commercially viable memory device that is both random access and nonvolatile using structure changing memory elements, as opposed to the charge storage memory elements used in most commercial memory devices. The use of electrically writable and erasable phase change materials, i.e., materials which can be electrically switched between generally amorphous and generally crystalline states or between different resistive states while in crystalline form, in memory applications is known in the art and is disclosed, for example, in U.S. Pat. No. 5,296,716 to Ovshinsky et al. The Ovshinsky patent contains a discussion of the general theory of operation of chalcogenide materials, which are a particular type of structure changing material.

As disclosed in the Ovshinsky patent, such phase change materials can be electrically switched between a first structural state, in which the material is generally amorphous, and a second structural state, in which the material has a generally crystalline local order. The material may also be electrically switched between different detectable states of local order across the entire spectrum between the completely amorphous and the completely crystalline states. In other words, the switching of such materials is not required to take place in a binary fashion between completely amorphous and completely crystalline states. Rather, the material may be switched in incremental steps reflecting changes of local order to provide a "gray scale" represented by a multiplicity of conditions of local order spanning the spectrum from the completely amorphous state to the completely crystalline state.

These memory elements are monolithic, homogeneous, and formed of chalcogenide material typically selected from the group of Te, Se, Sb, Ni, and Ge. This chalcogenide material exhibits different electrical characteristics depending upon its state. For instance, in its amorphous state the material exhibits a higher resistivity than it does in its crystalline state. Such chalcogenide materials may be switched between numerous electrically detectable conditions of varying resistivity in nanosecond time periods with the input of picojoules of energy. The resulting memory element is truly non-volatile. It will maintain the integrity of the information stored by the memory cell without the need for periodic refresh signals, and the data integrity of the information stored by these memory cells is not lost when power is removed from the device. The memory material is also directly overwritable so that the memory cells need not be erased, i.e., set to a specified starting point, in order to change information stored within the memory cells. Finally, the large dynamic range offered by the memory material theoretically provides for the gray scale storage of multiple bits of binary information in a single cell by mimicking the binary encoded information in analog form and, thereby, storing multiple bits of binary encoded information as a single resistance value in a single cell.

Traditionally, the operation of chalcogenide memory cells requires that a region of the chalcogenide memory material, called the "active region," be subjected to a current pulse to change the crystalline state of the chalcogenide material within the active region. Typically, a current density of between about $10^5$ and $10^7$ amperes/cm$^2$ is needed. To obtain this current density in a commercially viable device having at least one million memory cells, for instance, one theory suggests that the active region of each memory cell should be made as small as possible to minimize the total current drawn by the memory device.

However, such traditional chalcogenide memory cells have evolved into what is referred to as a programmable metallization cell or a plated chalcogenide memory cell for use in a plated chalcogenide random access memory (PCRAM) device. Such a cell includes a chalcogenide material between opposing electrodes. A fast ion conductor material is incorporated into the chalcogenide material. The resistance of such material can be changed between highly resistive and highly conductive states.

To perform a write operation with the memory cell in its normal high resistive state, a voltage potential is applied to a certain one of the electrodes, with the other of the electrode being held at zero voltage or ground. The electrode having the voltage applied to it functions as an anode, while the electrode held at zero or ground functions as a cathode. The nature of the fast ion conductor material is such that it undergoes a chemical and structural change at a certain applied voltage level. Specifically, at some suitable threshold voltage, the metal ions within the chalcogenide material begin to plate on the cathode and progress through the chalcogenide material toward the anode. The process continues until a conductive dendrite or filament extends between the electrodes, effectively interconnecting the top and bottom electrodes to create an electrical short circuit.

Once this occurs, dendrite growth stops, and the dendrite is retained when the voltage potentials are removed. This results in the resistance of the chalcogenide material between the electrodes dropping by a factor of about 1,000. The material can be returned to its highly resistive state by reversing the voltage potential between the anode and cathode to cause the dendrite to disappear. Again, the highly resistive state is maintained when the reverse voltage potential is removed. Accordingly, such a device can, for example, function as a reprogrammable memory cell of non-volatile random access memory circuit.

As mentioned above, the variable resistance material disposed between the electrodes typically is a chalcogenide material having metal ions diffused therein. A specific example is germanium selenide with silver ions. Typically, to provide the silver ions within the germanium selenide material, germanium selenide is deposited onto the first electrode using chemical vapor deposition. A thin layer of silver is then deposited on the glass, for example by physical vapor deposition or another technique. The layer of silver is then irradiated with ultraviolet radiation. The thin nature of the deposited silver allows the energy to pass through the silver to the silver/glass interface to cause the silver to diffuse into the chalcogenide material. The applied energy and overlying silver result in the silver migrating into the glass layer such that a homogenous distribution of silver throughout the layer is ultimately achieved.

Unfortunately, chalcogenide materials are relatively delicate. The nature of the deposition technique used to deposit the silver can damage the chalcogenide material,and, thus, adversely affect the resulting memory cell. Furthermore, it can be challenging to etch and polish chalcogenide materials. Accordingly, it would be desirable to develop memory cell fabrication methods that avoid steps that can damage such materials.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Specific embodiments of microprocessor-based systems, memories, memory elements, and methods of making such memory elements are described below as they might be implemented for use in semiconductor memory circuits. In the interest of clarity, not all features of an actual implementation are described in this specification. It should be appreciated that in the development of any such actual implementation, as in any engineering project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking for those of ordinary skill having the benefit of this disclosure.

Figure 1:
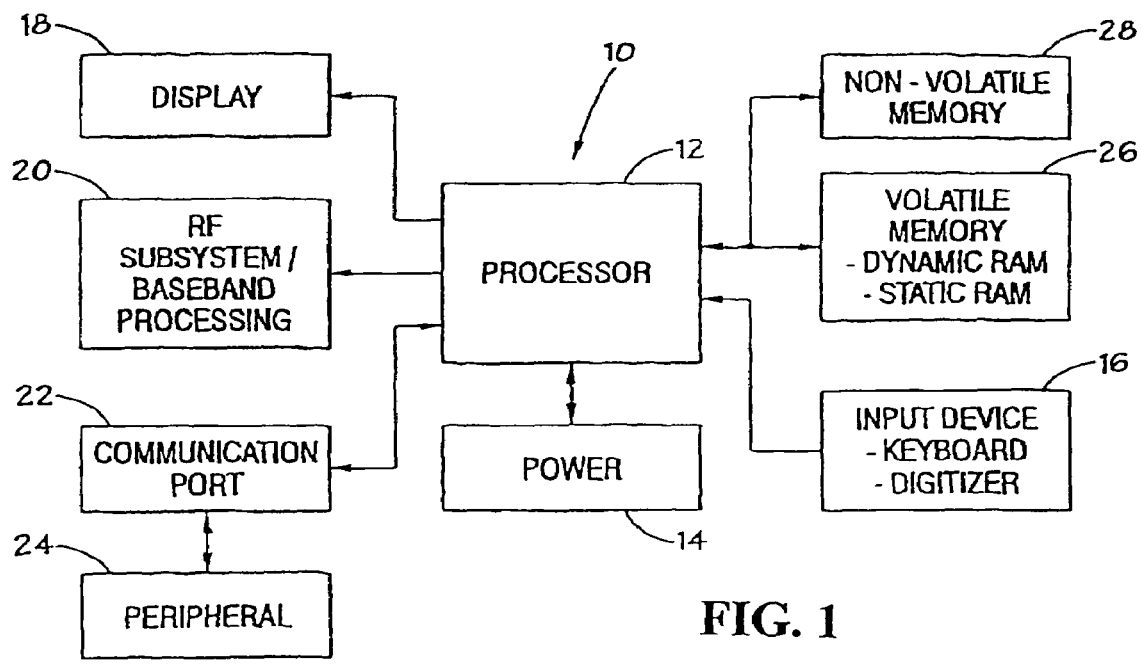
FIG. 1 illustrates a block diagram of an exemplary processor-based device.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, one or more processors 12, such as a microprocessor(s), control many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor(s) 12, depending upon the functions that the device 10 performs. For instance, a user interface 16 may be coupled to the processor(s) 12. The user interface 16 may include an input device, such as buttons, switches, a keyboard, a light pin, a mouse, and/or a voice recognition system, for instance. A display 18 may also be coupled to the processor(s) 12. The display 18 may include an LCD display, a CRT, LEDs, and/or an audio display. Furthermore, an RF subsystem/baseband processor 20 may also be coupled to the processor(s) 12. The RF subsystem/baseband processor 20 may include an antenna that is coupled to an RF receiver and to an RF transmitter (not shown). A communication port 22 may also be coupled to the processor(s) 12. The communication port 22 may be adapted to be coupled to a peripheral device 24, such as a modem, a printer, or a computer, for instance, or to a network, such as a local area network or the Internet.

Because the processor(s) 12 controls the functioning of the device 10 generally under the control of software programming, memory is coupled to the processor(s) 12 to store and facilitate execution of the software program. For instance, the processor(s) 12 may be coupled to volatile memory 26, which may include dynamic random access memory (DRAM), static random access memory (SRAM), Double Data Rate (DDR) memory, etc. The processor(s) 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

Figure 2:
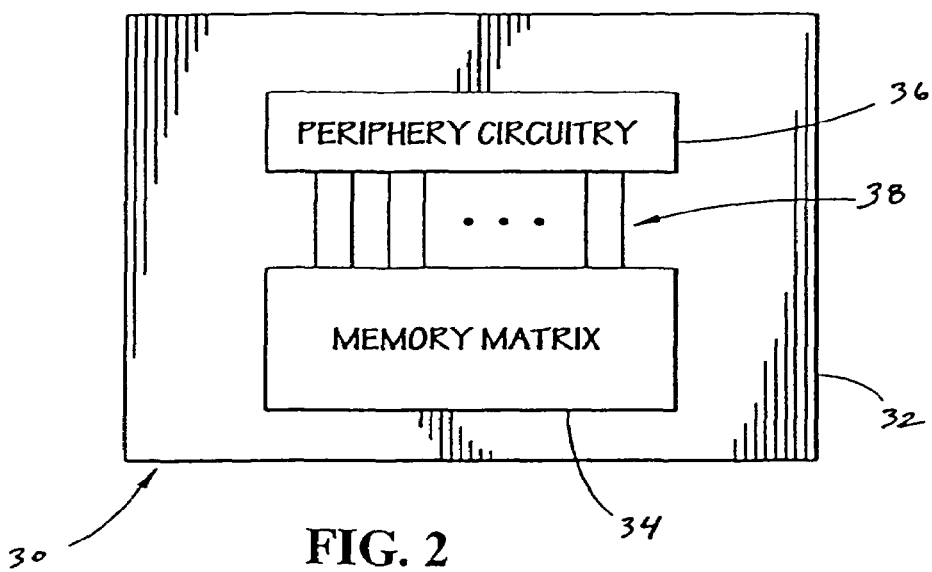
FIG. 2 illustrates an exemplary memory device.

An exemplary memory device is illustrated in FIG. 2 and generally designated by a reference numeral 30. The memory device 30 is an integrated circuit memory that is advantageously formed on a semiconductor substrate 32. The memory device 30 includes a to memory matrix or array 34 that includes a plurality of memory cells for storing data, as described below. The memory matrix 34 is coupled to periphery circuitry 36 by the plurality of control lines 38. The periphery circuitry 36 may include circuitry for addressing the memory cells contained within the memory matrix 34, along with circuitry for storing data in and retrieving data from the memory cells. The periphery circuitry 36 may also include other circuitry used for controlling or otherwise insuring the proper functioning of the memory device 30.

Figure 3:
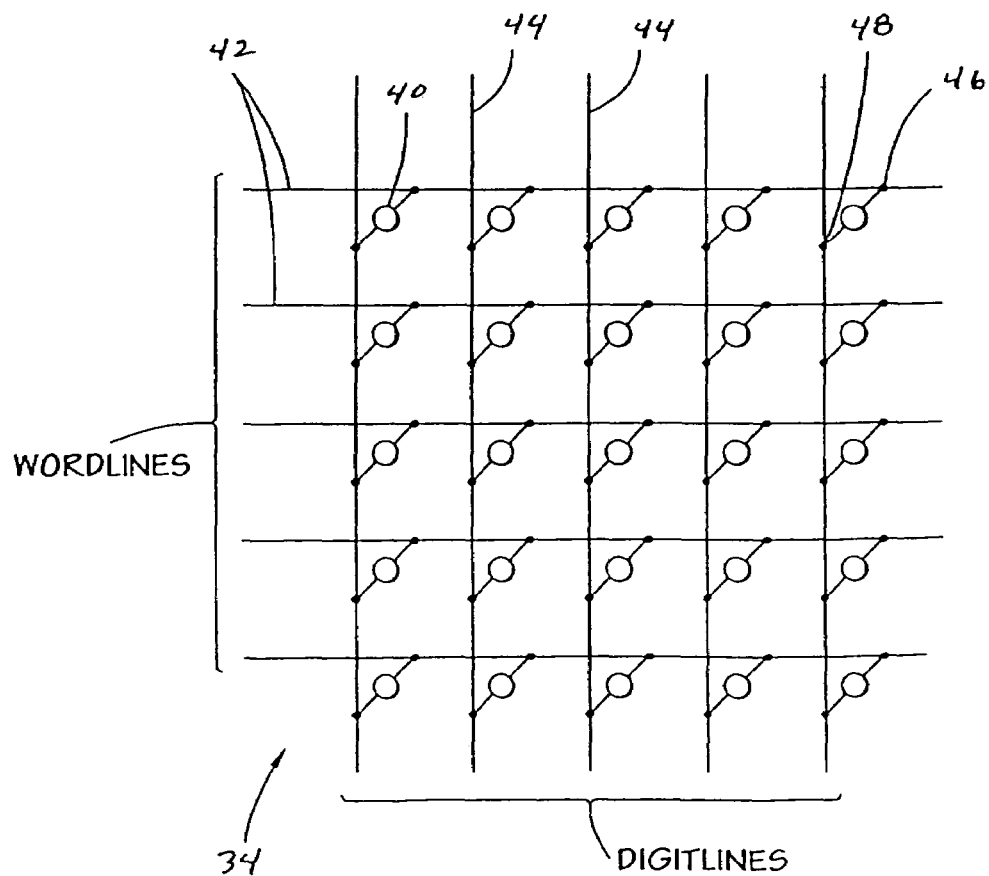
FIG. 3 illustrates a more detailed view of the memory array of the memory device illustrated in FIG. 2.

A more detailed depiction of the memory matrix 34 is illustrated in FIG. 3. As can be seen, the memory matrix 34 includes a plurality of memory cells 40 that are arranged in generally perpendicular rows and columns. The memory cells 40 in each row are coupled together by a respective word line 42, and the memory cells 40 in each column are coupled together by a respective digit line 44. Specifically, each memory cell 40 includes a word line node 46 that is coupled to a respective word line 42, and each memory cell 40 includes a digit line node 48 that is coupled to a respective digit line 44. The conductive word lines 42 and digit lines 44 are collectively referred to as address lines. These address lines are electrically coupled to the periphery circuitry 36 so that each of the memory cells 40 can be accessed for the storage and retrieval of information.

Figure 8:
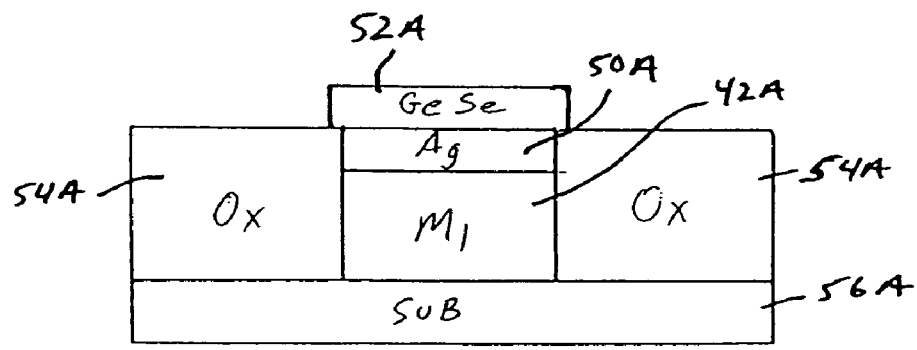
Figure 9:
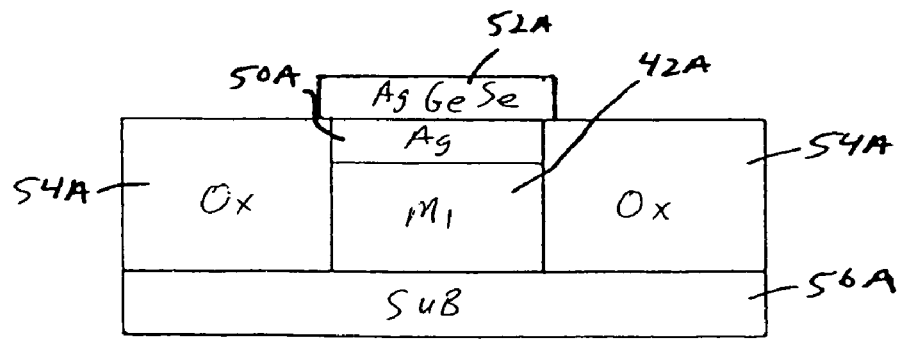
Figure 10:
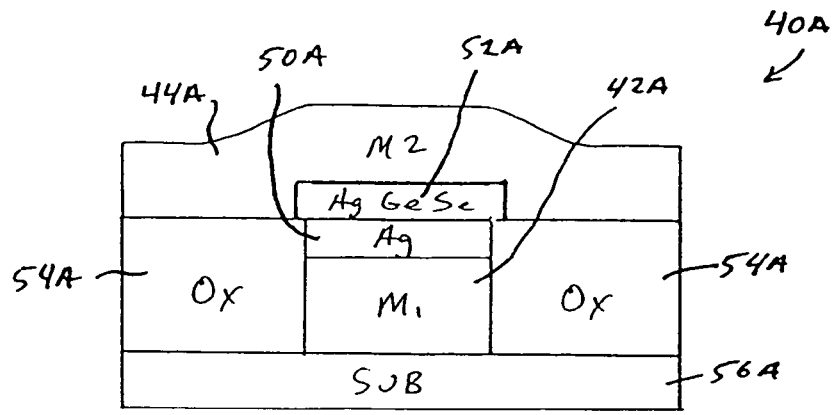

Turning now to FIGS. 4-10, a first exemplary embodiment of a memory cell 40 will be described. FIG. 10 illustrates the finished memory cell 40A, and FIGS. 4-9 illustrate the memory cell 40A at various stages of fabrication. The suffix "A" is used in describing this first embodiment for clarity so that similar reference numerals may be used to describe subsequent embodiments. As illustrated in FIG. 10, the finished memory cell 40A includes a word line 42A, which is often referred to as a Metal 1 (M1) layer. The word line 42A has a layer of conductive material 50A, such as silver (Ag), disposed thereon. A layer of chalcogenide material 52A, such as germanium selenide (GeSe), having metal ions diffused therein is disposed over the conductive layer 50A. The metal ions diffused in the chalcogenide material 52A typically originate in the layer of conductive material 50A. The digit line 44A, often referred to as a Metal 2 (M2) layer, is disposed over the chalcogenide layer 52A. Each memory cell 40A is typically isolated from adjacent memory cells by oxide regions 54A, and each memory cell 40A is typically fabricated on a substrate 56A.

Figure 4:
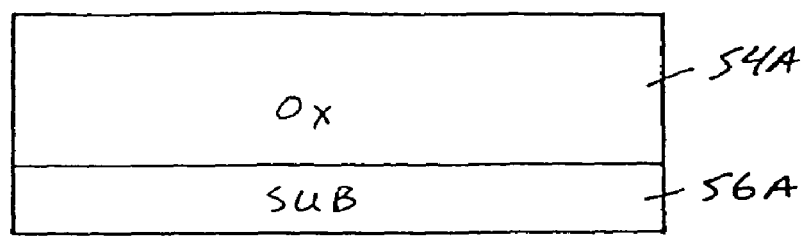
FIGS. 4-10 illustrate cross-sectional views of a memory cell during different stages of fabrication.

One method of fabricating the memory cell 40A is disclosed with reference to the various stages of fabrication illustrated in FIGS. 4-9. Referring first to FIG. 4, a substrate 56A is typically used as a base upon which the memory cells 40A of the memory array 44 are formed. In this discussion, the substrate 56A is generally used in a generic sense, because it is possible for the substrate 56A to take various forms depending upon the nature of the circuit design. For example, the substrate 56A may be a suitable semiconductor substrate, such as silicon or galium arsenide, or a suitable dielectric substrate, such as PECVD silicon dioxide. Furthermore, the substrate 56A may include layers, devices, and/or structures upon which or around which the memory cells 40A may be fabricated.

Figure 5:
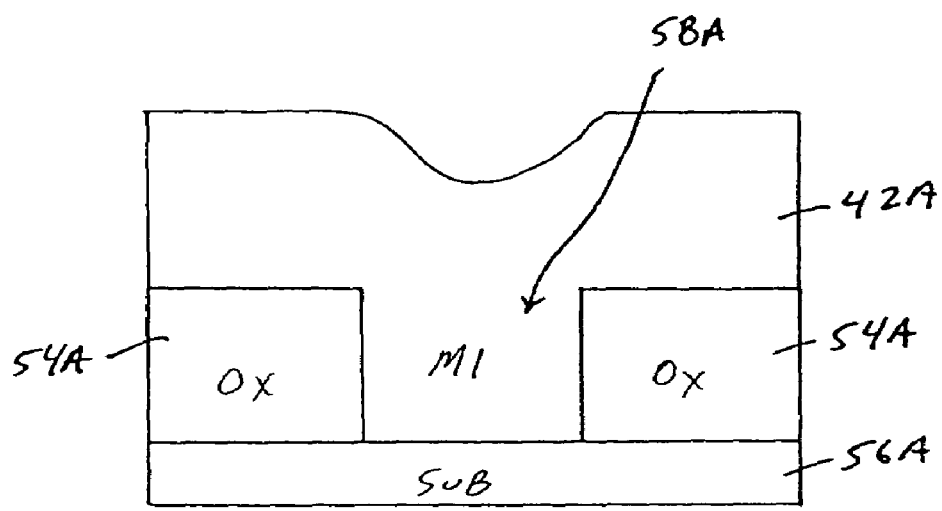

A layer of dielectric material 54A, for example an oxide such as silicon dioxide, is formed over the substrate 56A, as illustrated in FIG. 5. The layer of dielectric material 54A may be formed by any suitable process, such as by chemical vapor deposition. A window 58A is formed in the layer of dielectric material 54A. The window may extend partially through the layer of dielectric material 54A, or completely through the layer of dielectric material 54A to the substrate 56A, as illustrated in FIG. 5. The window 58A may be formed by any suitable process, such as by the use of standard photolithographic techniques.

Figure 6:
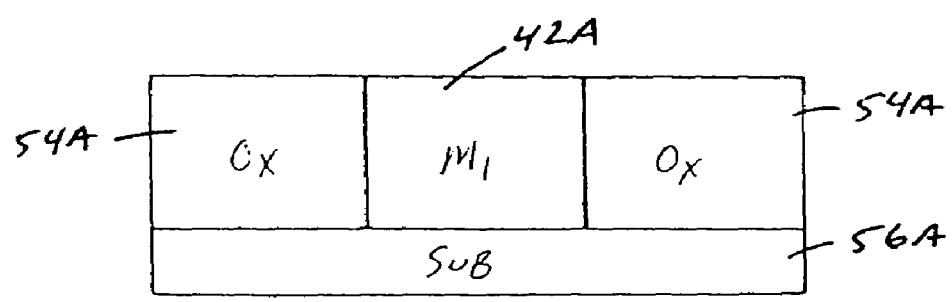
Figure 7:
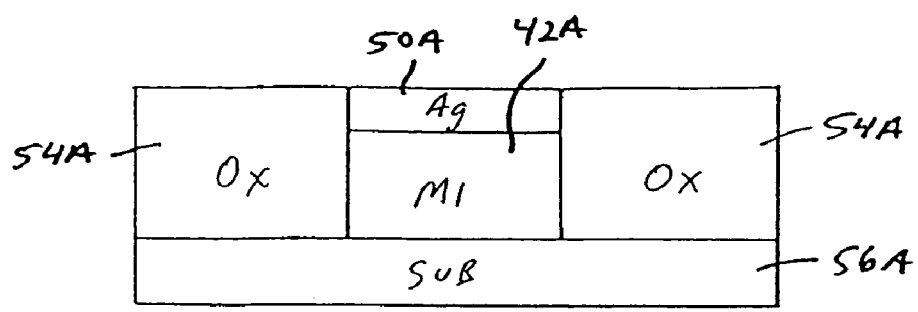

As illustrated in FIGS. 5 and 6, a layer of conductive material is deposited into the window 58A and planarized to form the word line 42A. Again, any suitable deposition technique, such as sputtering, and any suitable planarization technique, such as chemical mechanical planarization (CMP), may be used. The conductive material used to form the word line 42A is typically a metal, such as copper, tungsten, nickel, or aluminum. Although the word line 42A is illustrated as being formed in a dielectric material 54A in this embodiment, it should be appreciated that the word line 42A may be formed in other manners as well. For example, the word line 42A may be buried in the substrate 56A.

A fast ion conductive material is then disposed on the word line 42A. The fast ion conductive material is selected to cooperate with a subsequently applied layer of chalcogenide material to form the memory element of the memory cell 40A. In this embodiment, the word line 42A is plated with the conductive material 50A using an immersion plating process. In general, immersion plating replaces a less noble metal with a more noble metal. It is an ion exchange process that requires neither external electricity nor a catalyst. Immersion plating can be used in a self-limiting process, and it usually plates thinner films than other plating methods. Immersion plating depends on the base metal, i.e., the less noble metal. Many factors can influence immersion plating, such as the type of ligand used to take up the base metal and to keep the base metal in solution.

In this exemplary embodiment, the base metal of the word line 42A is selected to be copper, and the more noble metal of the conductive layer 50A is selected to be silver. Of course, it should be recognized that other base metals, such as nickel, aluminum, or tungsten, for example, may be used in place of copper, and that alloys of such metals may be used as well. In addition, various "more noble" metals, such as gold, may be used in place of silver. However, for the purposes of this exemplary embodiment utilizing copper and silver, a silver immersion solution called "argentomerse" available from Technic, Inc. may be used. This silver immersion solution utilizes a cyanide salt chemistry, which essentially represents a general purpose immersion plating solution. A silver immersion solution such as argentomerse should suffice for plating silver on base metals such as nickel or copper. However, for immersion plating of silver on tungsten, it may be desirable to utilize another silver immersion solution in order to optimize the chemistry. The structure illustrated in FIG. 6 is immersed in the silver immersion solution for a sufficient amount of time to form the layer of conductive material 50A. For example, the structure may be immersed in the solution for 15 to 30 minutes to form the conductive layer 50A having a thickness of 500 A to 2000 A.

After the conductive layer 50A has been formed on the word line 42A, a layer of chalcogenide material 52A, such as germanium selenide, may be formed over the conductive layer 50A, as illustrated in FIG. 8. The layer of chalcogenide material 52A may be formed by any suitable process, such as chemical vapor deposition. The layer of chalcogenide material 52A may have a thickness in the range of 200 A to 800 A, for example.

Once the layer of chalcogenide material 52A is formed over the layer of conductive material 50A, the structure illustrated in FIG. 8 is processed in a manner that causes at least a portion of the material in the conductive layer 50A to migrate into the layer of chalcogenide material 52A. In this embodiment, the structure illustrated in FIG. 8 is subjected to ultraviolet radiation and heat to cause silver atoms in the layer of conductive material 50A to migrate into the layer of chalcogenide material 52A. For example, the structure in FIG. 8 may be submitted to ultraviolet radiation in the range of 160 nm to 904 nm, e.g., 405 nm, at an intensity of 10 microjoules to 10 millijoules for a period of 5 to 30 minutes, and heat at a temperature of 50 to 85 degrees Celsius for a period of 5 to 20 minutes. Typically, the heat cycle is performed first, followed by the UV cycle.

After this conversion process, the layer of chalcogenide material 52A has metal ions in it, as illustrated in FIG. 9. Then, the Metal 2 (M2) layer, which forms the digit line 44A, may be disposed over the layer of chalcogenide material 52A, as illustrated in FIG. 10, to complete the memory cell 40A.

It should be appreciated from the discussion of the structure and method of fabrication of the memory cell 40A that it represents an inverted PCRAM memory cell. As discussed previously, a typical PCRAM memory cell is fabricated by forming a layer of chalcogenide material on the Metal 1 layer, thus requiring the conductive layer, such as silver, to be disposed on the chalcogenide layer. However, because chalcogenide is a very delicate material as discussed previously, known methods of depositing silver on chalcogenide are difficult to control in a reliable and repeatable fashion. However, by inverting the traditional PCRAM memory cell so that the conductive layer, such as silver, is disposed on the Metal 1 layer, the delicate nature of the subsequently deposited chalcogenide material does not pose a problem.

Figure 13:
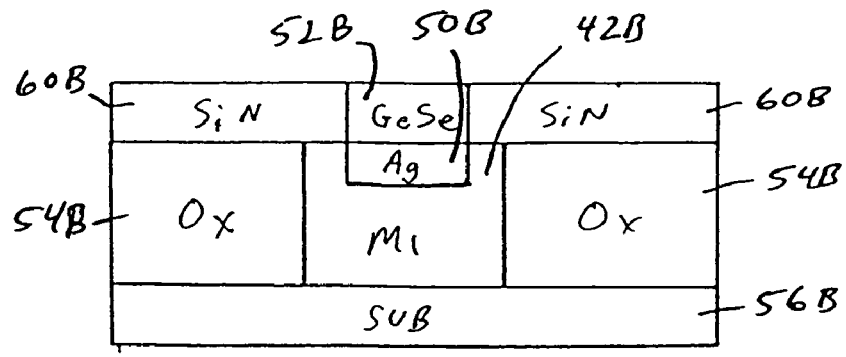
Figure 14:
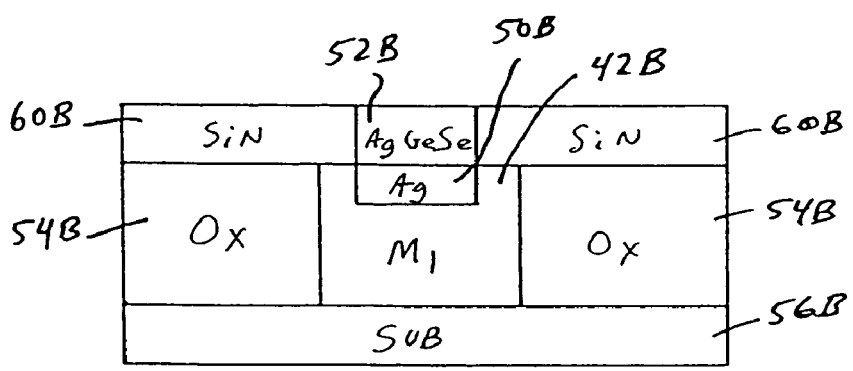
Figure 15:
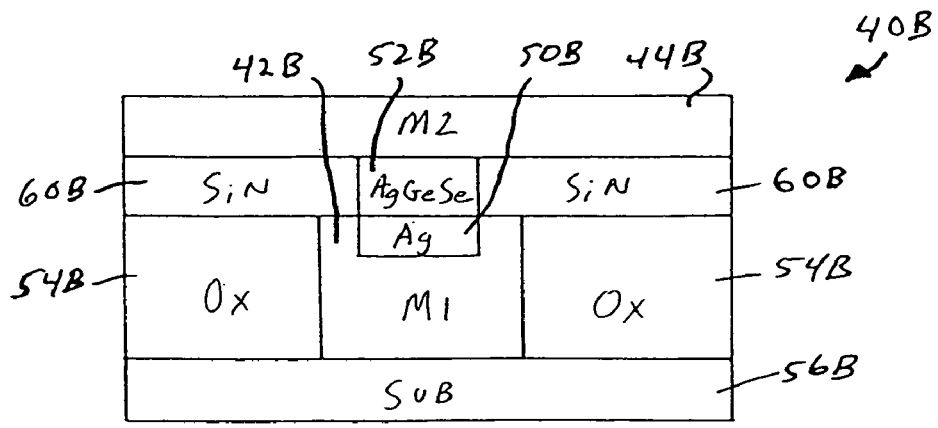

FIGS. 11-15 illustrate a second embodiment of the memory cell 40. FIG. 15 illustrates the finished memory cell 40B, and FIGS. 11-14 illustrate the memory cell 40B at various stages of fabrication. The suffix "B" is used in describing this second embodiment for clarity so that similar reference numerals may be used. As illustrated in FIG. 15, the finished memory cell 40B includes a word line 42B, which is again referred to as a Metal 1 (M1) layer. The word line 42B has a layer of conductive material 50B, such as silver (Ag), disposed thereon. A layer of chalcogenide material 52B, such as germanium selenide (GeSe), having metal ions diffused therein is disposed over the conductive layer 50B. Unlike the first embodiment, the layer of conductive material 50B and the layer of chalcogenide material 52B are disposed in a window created in a layer of dielectric material 60B. The digit line 44B, again referred to as a Metal 2 (M2) layer, is disposed over the chalcogenide layer 52B. Each memory cell 40B is typically isolated from adjacent memory cells by oxide regions 54B, and each memory cell 40B is typically fabricated on a substrate 56B.

Figure 11:
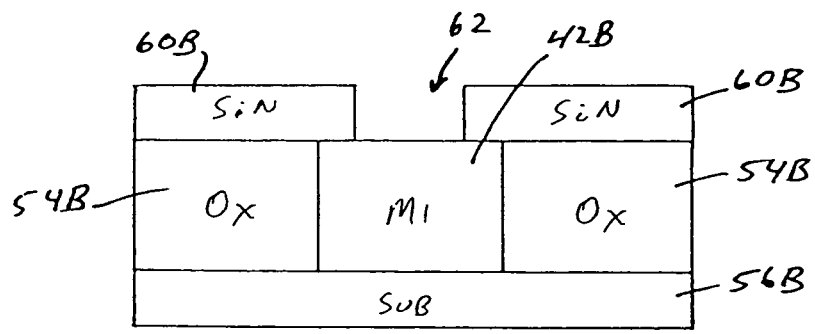
FIGS. 11-15 illustrate cross-sectional views of an alternate embodiment of a memory cell during different stages of fabrication.

One method of fabricating the memory cell 40B is disclosed with reference to the various stages of fabrication illustrated in FIGS. 11-14. However, before discussing FIGS. 11-14, it should be understood that the memory cell 40B first undergoes the stages of fabrication illustrated in FIGS. 4-6. Then, as illustrated in FIG. 11, a layer of dielectric material 60B is deposited over the structure, and a window 62 is formed in the layer of dielectric material 60B to expose at least a portion of the underlying word line 42B. The layer of dielectric material 60B may be deposited in any suitable manner, such as by chemical vapor deposition, and it may include any suitable dielectric, such as silicon nitride. The thickness of the layer of dielectric material 60B may be in the range of 200 A to 1000 A, for example.

Figure 12:
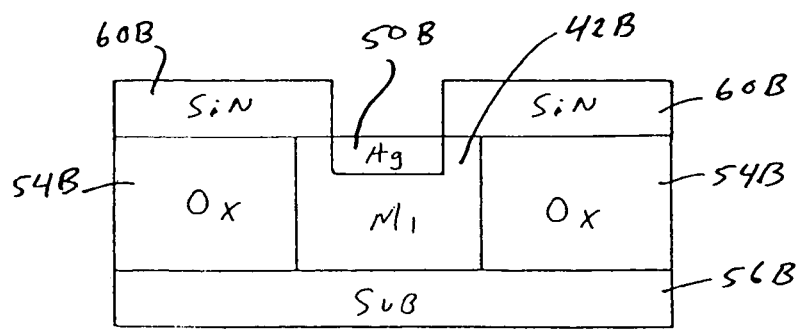

A fast ion conductive material is then disposed on the portion of the word line 42B exposed by the window 62. The selection of the fast ion conductive material and the manner in which it may be applied does not differ from the previous embodiment. Accordingly, for the sake of clarity, in this exemplary embodiment, the base metal of the word line 42B is selected to be copper, and the more noble metal of the conductive layer 50B is selected to be silver. The structure illustrated in FIG. 11 is immersed in the silver immersion solution for a sufficient amount of time to form the layer of conductive material 50B, as illustrated in FIG. 12.

After the conductive layer 50B has been formed on the word line 42B, a layer of chalcogenide material 52B, such as germanium selenide, may be deposited in the window 62 over the conductive layer 50B, as illustrated in FIG. 13. The layer of chalcogenide material 52B may be formed by any suitable process, such as chemical vapor deposition. The deposited layer of chalcogenide material 52B is then planarized, by chemical mechanical planarization for example, so that the layer of chalcogenide material 52B remains only within the window 62. Thus, the thickness of the layer of chalcogenide material 52B is approximately the same as the thickness of the layer of dielectric material 60B.

Once the layer of chalcogenide material 52B is formed in the window 62, the structure illustrated in FIG. 13 is processed in a manner that causes at least a portion of the material in the conductive layer 50B to migrate into the layer of chalcogenide material 52B. As in the previous embodiment, the structure illustrated in FIG. 13 is subjected to ultraviolet radiation and heat to cause silver atoms in the layer of conductive material 50B to migrate into the layer of chalcogenide material 52B.

After this conversion process, the layer of chalcogenide material 52B has metal ions in it, as illustrated in FIG. 14. Then, the Metal 2 (M2) layer, which forms the digit line 44B, may be disposed over the layer of dielectric material 60B and over the layer of chalcogenide material 52B, as illustrated in FIG. 15, to complete the memory cell 40B.

Figure 16:
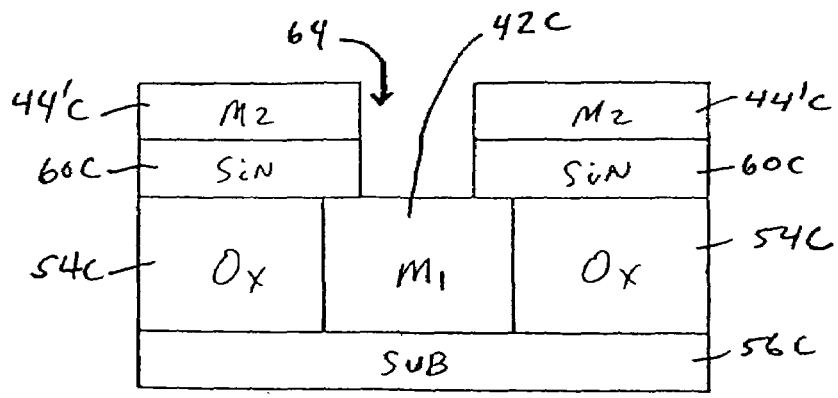
FIGS. 16-19 illustrate cross-sectional views of another alternate embodiment of a memory cell during different stages of fabrication.
Figure 17:
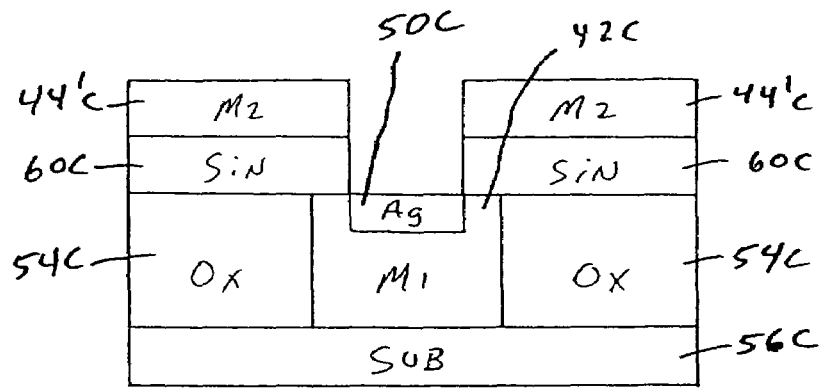
Figure 18:
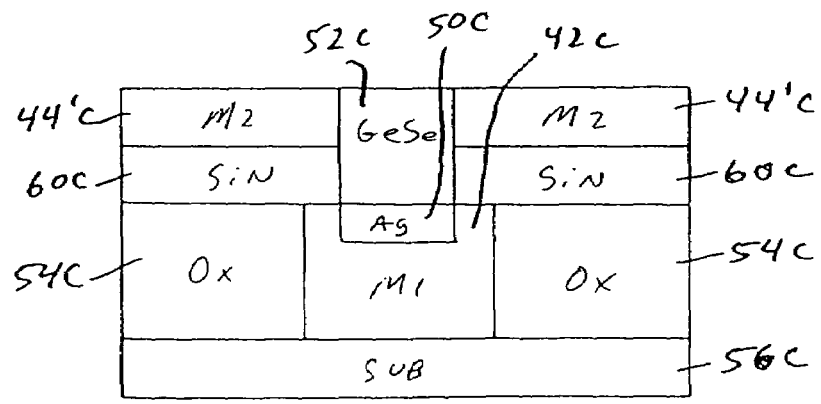
Figure 19:
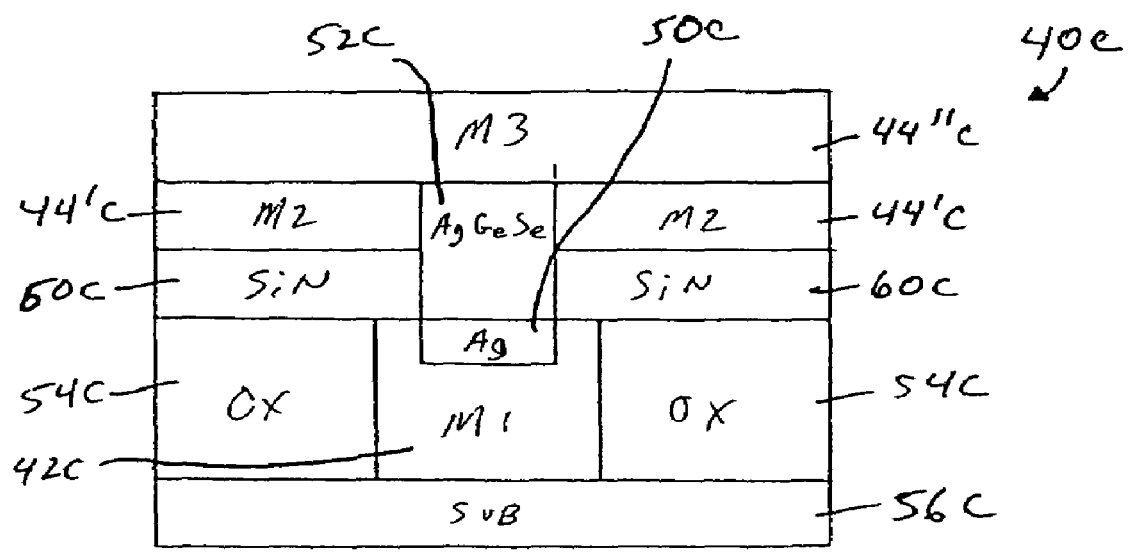

FIGS. 16-19 illustrate a third embodiment of the memory cell 40. FIG. 19 illustrates the finished memory cell 40C, and FIGS. 16-18 illustrate the memory cell 40C at various stages of fabrication. The suffix "C" is used in describing this third embodiment for clarity so that similar reference numerals may be used. As illustrated in FIG. 19, the finished memory cell 40C includes a word line 42C, which is again referred to as a Metal 1 (M1) layer. The word line 42C has a layer of conductive material 50C, such as silver (Ag), disposed thereon. A layer of chalcogenide material 52C, such as germanium selenide (GeSe), having metal ions diffused therein is disposed over the conductive layer 50C. Unlike the previous embodiments, the layer of conductive material 50C and the layer of chalcogenide material 52C are disposed in a window created in a layer of dielectric material 60C and in a layer of conductive material 44'C. The layer of conductive material 44'C forms a portion of the digit line and is again referred to as a Metal 2 (M2) layer. The other portion of the digit line is formed by a layer of conductive material 44"C, which is disposed over the chalcogenide layer 52C and over the Metal 2 layer. The layer of conductive material 44"C is referred to as the Metal 3 (M3) layer. Each memory cell 40C is typically isolated from adjacent memory cells by oxide regions 54C, and each memory cell 40C is typically fabricated on a substrate 56C.

One method of fabricating the memory cell 40C is disclosed with reference to the various stages of fabrication illustrated in FIGS. 16-18. However, before discussing FIGS. 16-18, it should be understood that the memory cell 40C first undergoes the stages of fabrication illustrated in FIGS. 4-6. Then, as illustrated in FIG. 16, a layer of dielectric material 60C is deposited over the structure, and a layer of conductive material 44'C (the Metal 2 layer) is deposited over the layer of dielectric material 60C. The layer of dielectric material 60C may be deposited in any suitable manner, such as by chemical vapor deposition, and it may include any suitable dielectric, such as silicon nitride. The layer of conductive material 44'C may be deposited in any suitable manner, such as by sputtering, and it may include any suitable conductive material, such as platinum, aluminum, or tungsten. The thickness of the layer of dielectric material 60C may be in the range of 200 A to 1000 A, for example, and the thickness of the layer of conductive material 44'C may be in the range of 500 A to 2000 A, for example.

A window 64 is formed in the layer of dielectric material 60C and in the layer of conductive material 44'C to expose at least a portion of the underlying word line 42C. The window 64 may be formed in any suitable manner, such as by the use of standard photolithographic techniques.

A fast ion conductive material is then disposed on the portion of the word line 42C exposed by the window 64. The selection of the fast ion conductive material and the manner in which it may be applied does not differ from the previous embodiments. Accordingly, for the sake of clarity, in this exemplary embodiment, the base metal of the word line 42C is selected to be copper, and the inore noble metal of the conductive layer 50C is selected to be silver. The structure illustrated in FIG. 16 is immersed in the silver immersion solution for a sufficient amount of time to form the layer of conductive material 50C, as illustrated in FIG. 17.

After the conductive layer 50C has been formed on the word line 42C, a layer of chalcogenide material 52C, such as germanium selenide, may be deposited in the window 64 over the conductive layer 50C, as illustrated in FIG. 18. The layer of chalcogenide material 52C may be formed by any suitable process, such as chemical vapor deposition. The deposited layer of chalcogenide material 52C is then planarized, by chemical mechanical planarization for example, so that the layer of chalcogenide material 52C remains only within the window 64. Thus, the thickness of the layer of chalcogenide material 52C is approximately the same as the thickness of the layers of dielectric material 60C and conductive material 44'C.

Once the layer of chalcogenide material 52C is formed in the window 64, the structure illustrated in FIG. 18 is processed in a manner that causes at least a portion of the material in the conductive layer 50C to migrate into the layer of chalcogenide material 52C. As in the previous embodiments, the structure illustrated in FIG. 18 is subjected to ultraviolet radiation and heat to cause silver atoms in the layer of conductive material 50C to migrate into the layer of chalcogenide material 52C.

After this conversion process, the layer of chalcogenide material 52C has metal ions in it, as illustrated in FIG. 19. Then, a layer of conductive material 44"C (the Metal 3 layer), which forms the remainder of the digit line, may be disposed over the layer of conductive material 44'C and over the layer of chalcogenide material 52C to complete the memory cell 40C.

As previously mention, chalcogenide material is somewhat susceptible to damage from planarization techniques, such as chemical mechanical planarization. However, it should be noted that the memory cell 40C is relatively immune to any "over planarization" of the chalcogenide material 52C within the window 64. Although the planarization step can remove some of the relatively delicate chalcogenide material 52C from the top of the window 64, the electrical path from the digit line 44C through the chalcogenide material 52C typically does not extend directly from the layer of conductive material 44"C. Rather, the shortest path typically extends from the edge of the layer of conductive material 44'C. Thus, for over planarization to affect the memory cell 40C adversely, chalcogenide material 52C below the level of the dielectric layer 60C would have to be removed. Since over planarization to such an extent is unlikely, the memory cell 40C typically provides for relatively repeatable and consistent memory operation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of making a memory cell, said method comprising:
   providing a semiconductor substrate;
   forming a dielectric layer over at least a portion of said semiconductor substrate;
   forming an opening in said dielectric layer;
   providing a first conductive material into at least a portion of said opening;
   providing a second conductive material over at least a portion of said first conductive material;
   forming a layer comprising a chalcogenide material over at least a portion of said second conductive material; and
   forming a third conductive material over at least a portion of said chalcogenide material.

2. The method of claim 1, wherein said opening extends partially through the dielectric layer.

3. The method of claim 1, wherein said opening extends completely through the dielectric layer exposing a top surface of the semiconductor substrate.

4. The method of claim 1, wherein first conductive material is processed to form a word line.

5. The method of claim 1, wherein said layer comprising a chalcogenide material is formed to have a thickness in the range of 200 Å to 800 Å.

6. The method of claim 1, further comprising processing said layer comprising a chalcogenide material and said second conductive material resulting in conductive ions from said second conductive material to migrate into said layer comprising a chalcogenide material.

7. The method of claim 1, wherein said layer comprising a chalcogenide material further comprises metal ions.

8. The method of claim 1, wherein said third conductive material is processed to form a digit line.

9. The method of claim 4, wherein said word line is plated with the second conductive material using an immersion plating process.

10. The method of claim 9, wherein said immersion plating process is conducted for 15 to 30 minutes to form the second conductive material having a thickness of 500 Å to 2000 Å.

11. The method of claim 6, wherein step of processing includes exposing said layer comprising a chalcogenide material and said second conductive material to ultraviolet radiation and heat.

12. A method of making a memory cell, said method comprising:
    providing a semiconductor substrate;
    forming a first dielectric layer over at least a portion of said semiconductor substrate;
    forming a first opening in said first dielectric layer;
    providing a first conductive material into at least a portion of said first opening;
    forming a second dielectric layer over at least a portion of said first conductive material and said first dielectric layer;
    forming a second opening in said second dielectric layer, wherein said second opening extends at least to expose a portion of said first conductive material;
    providing a second conductive material into at least a portion of said second opening;
    forming a chalcogenide layer over at least a portion of said second conductive material and within at least a portion of said second opening; and
    forming a third conductive material over at least a portion of said chalcogenide layer.

13. The method of claim 12, wherein first conductive material is processed to form a word line.

14. The method of claim 12, wherein said word line is plated with the second conductive material using an immersion plating process.

15. The method of claim 12, wherein said second dielectric layer is formed to have a thickness in the range of 200 Å to 1000 Å.

16. The method of claim 12, wherein said chalcogenide layer is planarized and substantially fills the second opening.

17. The method of claim 16, further comprising processing said chalcogenide layer and said second conductive material resulting in at least some conductive ions from said second conductive material to migrate into said chalcogenide layer.

18. The method of claim 12, wherein said chalcogenide layer further comprises conductive ions from said second conductive material.

19. The method of claim 12, wherein said third conductive material is processed to form a digit line.

20. The method of claim 17, wherein step of processing includes exposing said chalcogenide layer and said second conductive material to ultraviolet radiation and heat.

21. A method of making a memory cell, said method comprising:
    providing a semiconductor substrate;
    forming a first dielectric layer over at least a portion of said semiconductor substrate;
    forming a first opening in said first dielectric layer;
    providing a first conductive material into at least a portion of said first opening;
    forming a second dielectric layer over at least a portion of said first dielectric layer;
    providing a second conductive material over at least a portion of said second dielectric layer;
    forming a second opening in said second dielectric layer and said second conductive material wherein at least a portion of said first conductive material is exposed;
    providing a third conductive material into at least a portion of said second opening;
    forming a chalcogenide layer over at least a portion of said third conductive material and within at least a portion of said second opening; and
    forming a fourth conductive material over at least a portion of said chalcogenide layer.

22. The method of claim 21, wherein first conductive material is processed to form a word line.

23. The method of claim 22, wherein said word line is plated with the third conductive material using an immersion plating process.

24. The method of claim 21, wherein said second dielectric layer is formed to have a thickness in the range of 200 Å to 1000 Å.

25. The method of claim 21, wherein said second conductive material is formed to have a thickness in the range of 500 Å to 2000 Å.

26. The method of claim 21, wherein said chalcogenide layer is planarized and substantially fills the second opening.

27. The method of claim 21, wherein said chalcogenide layer further comprises conductive ions from said third conductive material.

28. The method of claim 21, wherein said fourth conductive material is processed to form a digit line.

29. The method of claim 26, further comprising processing said chalcogenide layer and said third conductive material resulting in at least some conductive ions from said third conductive material to migrate into said chalcogenide layer.

30. The method of claim 29, wherein step of processing includes exposing said chalcogenide layer and said third conductive material to ultraviolet radiation and heat.

* * * * *

UNITED STATES PATENT AND TRADEMARK OFFICE
CERTIFICATE OF CORRECTION

| | | |
|---|---|---|
| PATENT NO. | : 7,235,419 B2 | Page 1 of 1 |
| APPLICATION NO. | : 11/302119 | |
| DATED | : June 26, 2007 | |
| INVENTOR(S) | : Steven T. Harshfield et al. | |

It is certified that error appears in the above-identified patent and that said Letters Patent is hereby corrected as shown below:

In the Specification, the following errors are corrected:

Column 1, line 56, "are more" should read --or more--;

Column 3, line 25, "of non-volatile" should read --of a non-volatile--;

Column 9, line 43, "inore" should read --more--; and

Column 10, line 11, "mention" should read --mentions--.

In the Claims, the following errors are corrected:

Claim 11, column 11, line 14, "wherein step" should read --wherein said step--;

Claim 13, column 11, line 39, "wherein first" should read --wherein said first--; and Claim 20, column 12, line 3, "wherein step" should read --wherein said step--.

Signed and Sealed this

Ninth Day of October, 2007

JON W. DUDAS
*Director of the United States Patent and Trademark Office*